US008045733B2

(12) United States Patent
Zhe et al.

(10) Patent No.: US 8,045,733 B2

(45) Date of Patent: Oct. 25, 2011

(54) SILICON MICROPHONE WITH ENHANCED IMPACT PROOF STRUCTURE USING BONDING WIRES

(75) Inventors: Wang Zhe, Singapore (SG); Chong Ser Choong, Singapore (SG)

(73) Assignee: Shandong Gettop Acoustic Co., Ltd., Shandong (CN)

( * ) Notice: Subject to any disclaimer, the term of this patent is extended or adjusted under 35 U.S.C. 154(b) by 1054 days.

(21) Appl. No.: 11/973,075

(22) Filed: Oct. 5, 2007

(65) Prior Publication Data

US 2009/0092273 A1 Apr. 9, 2009

(51) Int. Cl.

*H04R 25/00* (2006.01)
*H04R 19/00* (2006.01)
*H01L 21/00* (2006.01)

(52) U.S. Cl. ........ 381/174; 381/191; 381/369; 367/181; 438/53

(58) Field of Classification Search ........................ None
See application file for complete search history.

(56) References Cited

U.S. PATENT DOCUMENTS

| | | | | |
|---|---|---|---|---|
| 4,182,937 | A | 1/1980 | Greenwood | |
| 5,452,268 | A * | 9/1995 | Bernstein | 367/181 |
| 7,346,178 | B2 * | 3/2008 | Zhe et al. | 381/174 |
| 7,804,969 | B2 * | 9/2010 | Wang et al. | 381/174 |
| 7,829,366 | B2 * | 11/2010 | Miller et al. | 438/53 |
| 2002/0067663 | A1 * | 6/2002 | Loeppert et al. | 367/181 |
| 2004/0184633 | A1 | 9/2004 | Kay et al. | |
| 2006/0093170 | A1 * | 5/2006 | Zhe et al. | 381/191 |
| 2008/0123878 | A1 * | 5/2008 | Zhe et al. | 381/191 |
| 2009/0208037 | A1 * | 8/2009 | Zhe | 381/174 |

FOREIGN PATENT DOCUMENTS

WO PCT/SG 2008/000369 12/2008

OTHER PUBLICATIONS

Co-pending U.S. Appl. No. 11/500,114, filed Aug. 7, 2006 , "Silicon Microphone With Impact Proof Structure", Assigned to the Same Assignee As the Present Invention.

* cited by examiner

*Primary Examiner* — Alonzo Chambliss

(74) *Attorney, Agent, or Firm* — Saile Ackerman LLC; Stephen B. Ackerman

(57) ABSTRACT

A backplateless silicon microphone and a wire protection method for improved impact resistance are disclosed. A circular diaphragm is surrounded by a circular spring having a plurality of slots and perforations to facilitate air damping reduction, release of in-plane stress, and improve out-plane flexibility. Anchored at a substrate, the circular spring holds the silicon microphone suspended over a backside hole in the substrate but allows the diaphragm to vibrate perpendicular to the substrate. A microphone variable capacitor is formed between the perforated spring and substrate. Slot size is minimized to prevent particles from entering an underlying air gap. A plurality of "n" bonding pads near the outer edge of the circular spring are connected by "n/2" bonding wires that serve as a stopper to restrict an upward motion of the diaphragm. The bonding wires may cross each other to enable lower loop height for more effective resistance to impact.

25 Claims, 9 Drawing Sheets

SILICON MICROPHONE WITH ENHANCED IMPACT PROOF STRUCTURE USING BONDING WIRES

RELATED PATENT APPLICATION

This application is related to the following: Ser. No. 11/500,114, filing date Aug. 7, 2006; assigned to a common assignee and herein incorporated by reference in its entirety.

FIELD OF THE INVENTION

The invention relates to a sensing element of a silicon condenser microphone and a method for making the same, and in particular, to a silicon microphone structure without a dedicated backplate that employs crossed wire bonding above a diaphragm element to prevent breakage from large diaphragm movements.

BACKGROUND OF THE INVENTION

In the fast growing consumer electronic product market, there is increasing competition not only in product functionality but also in product reliability performance. For hand held electronic gadgets, the impact proof requirement is becoming more and more stringent. It is not unusual now to require a hand held device like a mobile phone to survive the impact from a 5000 gram weight and/or a free drop from a height of 1.5 meters to a steel plate, a process that can be repeated up to 10 times during a test.

Another electronic device that is also tested under similar conditions, a backplateless silicon microphone, was previously disclosed in a Silicon Matrix Pte Ltd patent application S106-002 and features a movable diaphragm which is supported at its edges, corners, or center by mechanical springs that are anchored to a conductive substrate through rigid pads. In addition, there are stoppers formed above perforated plate extensions of the diaphragm that restrict large movements in a direction perpendicular to an underlying backside hole and thereby minimize breakage. However, the stopper components complicate the fabrication process and there may be a compatibility issue between the stopper and the silicon membrane to which it is attached. Therefore, an improved silicon microphone design is desirable that features a structure to prevent device breakage from strong impact and can be made by a method that does not add complexity to the fabrication process or result in compatibility issues between various components.

SUMMARY OF THE INVENTION

One objective of the present invention is to provide a silicon microphone without a dedicated backplate component that has a design feature which prevents a large movement in the suspended diaphragm from breaking the device.

A further objective of the present invention is to provide a silicon microphone design according to the first objective that does not add complexity to the fabrication process.

These objectives are achieved in various embodiments of a silicon microphone design that is comprised of a diaphragm which is suspended over a backside hole formed in a conductive substrate. A plurality of perforated plates is attached to the diaphragm and a spring surrounds the perforated plates and diaphragm. The spring is held to the substrate through a plurality of anchors. Each anchor comprises a rigid pad and an underlying dielectric layer. The shapes of the perforated plates, diaphragm, spring, and rigid pads are all defined by a plurality of slots formed within a membrane layer.

In a first embodiment, the spring and diaphragm are essentially circular in shape, and the spring comprises a circular ring and a plurality of inner beams which is attached to the circular outer edge of the diaphragm. The spring is also comprised of a plurality of outer beams attached to the plurality of rigid pads of the anchors wherein one outer beam is connected to one rigid pad. Such a spring is formed to release in-plane stress and allow more out-plane flexibility. The diaphragm has a diameter slightly larger than the diameter of the underlying backside hole to avoid direct acoustic leakage.

The outer beams of the spring connect to a plurality of anchors which hold the diaphragm, spring, and perforated plates in place but allow movement of the diaphragm, perforated plates, and circular spring in a direction perpendicular to the substrate. Each rigid pad is disposed on a dielectric layer which acts as a spacer to define an air gap between the diaphragm and the substrate. One or more of the rigid pads have an overlying first electrode which is an island of a conductive metal that is connected by wiring to external circuitry. A second electrode of the same material composition is formed on the conductive substrate and is connected to a first electrode to complete a variable capacitor with one pole on the perforated plates and spring, and another pole on the substrate. Preferably, the diaphragm, perforated plates, spring, and rigid pads are coplanar and are made from the same polysilicon membrane layer and the dielectric spacer is a silicon oxide layer. Perforations formed in the perforated plates and in the spring are holes that may be arranged in various designs to allow removal of an underlying dielectric layer during the fabrication process. The holes also allow air ventilation and thus reduce the air damping in the narrow air gap below the diaphragm, spring, and perforated plates during vibrations.

An air gap exists in the dielectric spacer layer between the substrate and the perforated plates, diaphragm, and spring, and a back hole is formed in the substrate below the diaphragm so that a sound signal emanating from beyond the backside of the substrate has a free path to the diaphragm and thereby induces vibrations in the diaphragm. The diaphragm, perforated plates, and perforated spring move up and down (perpendicular to the substrate) in a concerted motion during a vibration. This movement results in a capacitance change between the first and second electrodes which can be converted into an output voltage.

The plurality of slots which define the plurality of perforated plates, spring, and plurality of rigid pads are openings that have a size that is sufficiently small enough to prevent particles that could inhibit the motion of the silicon microphone from passing through the opening and entering the air gap below. In the exemplary embodiment, there are four perforated plates each having an arc shape with a first side adjoining the outer edge of the diaphragm and three sides defined by slots. A second side opposite the first side may be slightly curved and concentric with the curved outer edge of the diaphragm. Third and fourth sides are preferably shorter than the second side and each of the third and fourth sides are aligned toward the center of the diaphragm and have an end that overlaps an end of the second side. A second end of the third and fourth sides is proximate to the outer edge of the diaphragm. Thus, a third side in each perforated plate faces an adjacent perforated plate and a fourth side in each perforated plate faces an adjacent perforated plate but not the same perforated plate as the third side. Adjacent perforated plates are separated by the inner beams of the spring.

Another important feature is the formation of a plurality of bonding pads outside the outer edge of the spring that enable bonding wires to cross over the diaphragm from a first bond site to a second bond site in a variety of patterns. Thus, if there are "n" bonding pads arrayed on the membrane layer along the outer edge of the spring, the number of bonding wires crossing the diaphragm is "n/2" and these wires are used advantageously to prevent vibrations in the diaphragm and spring from becoming too large and causing device breakage.

In a second embodiment, the perforated spring has three types of slots that may be referred to as inner slots, middle slots, and an outer continuous slot, and the perforated plates are omitted. Although the diaphragm and spring may have a rectangular, square, or other polygonal shapes, the exemplary embodiment shows a circular diaphragm surrounded by a circular spring. The diaphragm may have ribs radiating from a center point to the outer edge in order to strengthen the diaphragm. The circular spring is essentially comprised of two interconnected ring springs and a plurality of perforated beams connecting the outer edge of the outer ring spring to a plurality of anchors. The inner ring spring is attached to certain portions of the edge of the diaphragm. The outer ring spring is attached via perforated beams to a plurality of rigid pads which are anchored to the conductive substrate through a dielectric layer. Inner and outer ring springs are perforated with holes. Furthermore, there is a plurality of "n" bonding pads outside the outer edge of the perforated spring to allow a plurality of "n/2" bonding wires to cross over the diaphragm or circular spring and thereby restrict the motion of the diaphragm and perforated circular spring in a direction perpendicular to the backside hole.

There is a third embodiment similar to the second embodiment except the shape of the diaphragm and surrounding spring are essentially square. Preferably, there is a plurality of sealing ribs proximate to each side of the diaphragm and the sealing ribs may be formed equidistant from the nearest diaphragm side. An outer slot forms an essentially square shape except for the outer slot sections around the pads and perforated beams. Each of the four inner slots have a linear shape and is formed parallel to a side of the diaphragm and is a first distance from the nearest side of the diaphragm. Middle slots have an "L" shape with a first section formed parallel to a first side of the diaphragm and a second section that is formed parallel to a second side of the diaphragm. The ends of adjacent middle slots are separated by a portion of spring.

In a fourth embodiment, each of the perforated beams in the third embodiment is shifted from a corner of the square spring to a position proximate to a midpoint of a side of the square spring. Likewise, each of the pads is moved and connects with an end of a perforated beam opposite the spring. One or more bonding pads are formed on the membrane layer adjacent to a pad along each side of the spring. The inner slots are formed such that a first section of each inner slot is parallel to a first side of the diaphragm and a second section is formed parallel to a second side of the diaphragm, thus forming an "L" shape. An end of the first section and an end of the second section are formed a first distance from the nearest side of a diaphragm edge. Each of middle slots is formed parallel to a side of diaphragm at a second distance from the diaphragm edge wherein the second distance is greater than the first distance.

There is a fifth embodiment in which the slot configuration in the third embodiment has been modified to include a fourth type of slot to give a triple folded spring configuration. In this example, there are inner slots as described previously and the middle slots are now replaced by middle inner slots. There is also a plurality of middle outer slots formed between middle inner slots and the outer slot. In the exemplary embodiment, there are four middle inner slots and four middle outer slots. Each middle outer slot has one section formed parallel to a first side of the diaphragm and a second section formed parallel to a second side of the diaphragm. A middle outer slot has two ends that are formed a third distance from the nearest side of the diaphragm. The third distance is greater than the second distance of the middle inner slots. Thus, a first portion of the spring is between the inner slots and middle inner slots, a second portion is formed between the middle inner slots and middle outer slots, and a third portion is formed between the middle outer slots and continuous outer slot.

DETAILED DESCRIPTION OF THE INVENTION

The present invention discloses a backplateless silicon microphone design that takes advantage of a folded and perforated spring and crossed bonding wires to improve resistance to breakage from strong impact. The figures are not necessarily drawn to scale and the relative sizes of various elements in the structures may be different than in an actual device. The present invention also encompasses a method of forming a silicon microphone according to an embodiment described herein. The terms "surface microstructure" may be used interchangeably with "silicon microphone".

Figure 1A:
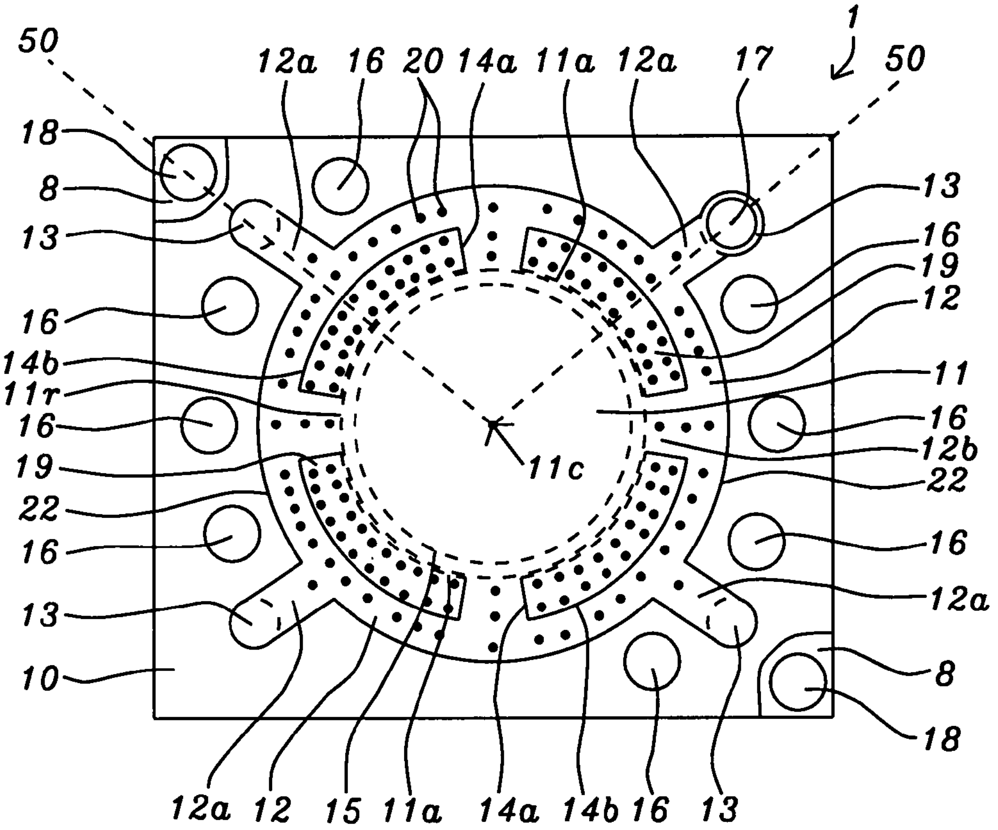
FIG. 1*a* is a top view depicting a backplateless silicon microphone with a circular spring, perforated plates, and diaphragm, and additional bonding pads for attaching bonding wires thereto according to a first embodiment of the present invention.

Referring to FIG. 1*a*, a first embodiment of a backplateless silicon microphone 1 having improved impact resistance is depicted from a top view. The silicon microphone 1 is fabricated from a membrane layer 10 on a substrate 8 such as silicon which preferably has low resistivity. Optionally, the substrate 8 may be glass with a conductive layer formed thereon. The silicon microphone 1 is based on a membrane layer 10 that is fabricated into a diaphragm which is suspended over an air gap and surrounded by a plurality of perforated plates 19 and a spring 12. The spring 12 is held to the substrate by a plurality of anchors 13. Each of the perforated plates 19 has four sides wherein one side is attached to the outer edge 11*a* of the diaphragm and the other three sides are formed by slots 14*a*, 14*b*. In the exemplary embodiment, the diaphragm 11 is essentially planar and has a circular shape with an outer edge 11*a* that extends beyond the underlying backside hole 15. In addition, the spring 12 has a circular shape. However, the present invention also anticipates a diaphragm 11, spring 12, and perforated plates 19 that may have a polygonal shape as appreciated by those skilled in the art. It should be understood that the spring 12 that surrounds the diaphragm may have a different shape than the diaphragm 11.

The diaphragm 11 is made of doped silicon, doped polysilicon, Au, Ni, Cu, or other semiconductor materials or metals and is supported along its outer edge 11*a* by attachment to portions of the circular spring 12 and portions of perforated plates 19 that are comprised of the same material and have the same thickness as the diaphragm 11. The circular spring 12 has a perimeter that is interrupted at a plurality of locations where a plurality of "m" outer beams 12*a* are formed and serve as connections to a plurality of "m" pads 13 outside the perimeter of the circular spring where "m" is preferably >3. The pads 13 are also made from the same membrane layer 10 as the diaphragm 11, perforated plates 19, and circular spring 12. Unlike the circular spring 12, perforated plates 19, and diaphragm 11 which have flexibility to vibrate in a direction perpendicular to the underlying backside hole 15, the pads 13 are rigidly held in position by attachment to an underlying dielectric layer (not shown) which in turn is formed on the substrate 8. Each pad 13 and underlying portion of dielectric layer form a rigid structure called an anchor. Outer beams 12*a* provide torsional stress buffering at the pads 13 which in one embodiment are formed equidistant from the diaphragm center 11*c*. There is a continuous outer slot 22 that separates the pads 13 and circular spring 12 including outer beams 12*a* from the membrane layer 10.

One important feature is that the circular spring 12 is comprised of a plurality of slots 14*a*, 14*b*, 22 that each represent a narrow gap having a width of about 3 to 10 microns. Thus, the circular spring 12 can release in-plane stress and has more out-plane flexibility. The circular spring is also comprised of a plurality of inner beams 12*b* connected to the outer edge 11*a* of the diaphragm 11 and formed between adjacent slots 14*a*. The size of slots 14*a*, 14*b* may be minimized based on processing constraints to prevent particles from passing through the slot into the underlying air gap (not shown) and thereby restricting the motion of the diaphragm 11 and spring 12 in a direction perpendicular to the backside hole 15. In the exemplary embodiment, there are four arc shaped perforated plates 19 arranged around the outer edge 11*a* of the diaphragm 11. The shape of a perforated plate 19 is defined by a slot 14*b* opposite a side of the perforated plate that adjoins outer edge 11*a* and two slots 14*a* connected to slot 14*b*.

In the exemplary embodiment, slot 14*b* is essentially concentric to the nearest section of outer edge 11*a* and has two ends wherein one end overlaps an end of a slot 14*a* and a second end overlaps an end of a second slot 14*a*. Slots 14*a* are aligned toward the diaphragm center 11*c* and preferably have a shorter length than slots 14*b*. A slot 14*a* in one perforated plate 19 faces a slot 14*a* in an adjacent perforated plate 19 and the facing slots 14*a* are separated by an inner beam 12*a* of circular spring 12. Preferably, all slots 14*b* are disposed the same distance from the diaphragm center 11*c*. Alternatively, other designs for the plurality of slots may be used. However, each perforated plate 19 should be defined by at least one slot aligned in a direction that is substantially concentric to the nearest section of outer edge 11*a*. There is a plurality of perforations 20 or holes arranged in various patterns within each perforated plate 19 to allow air ventilation and reduce the air damping in the narrow air gap (not shown) between the perforated plates and substrate 8 during vibrations.

Figure 3:
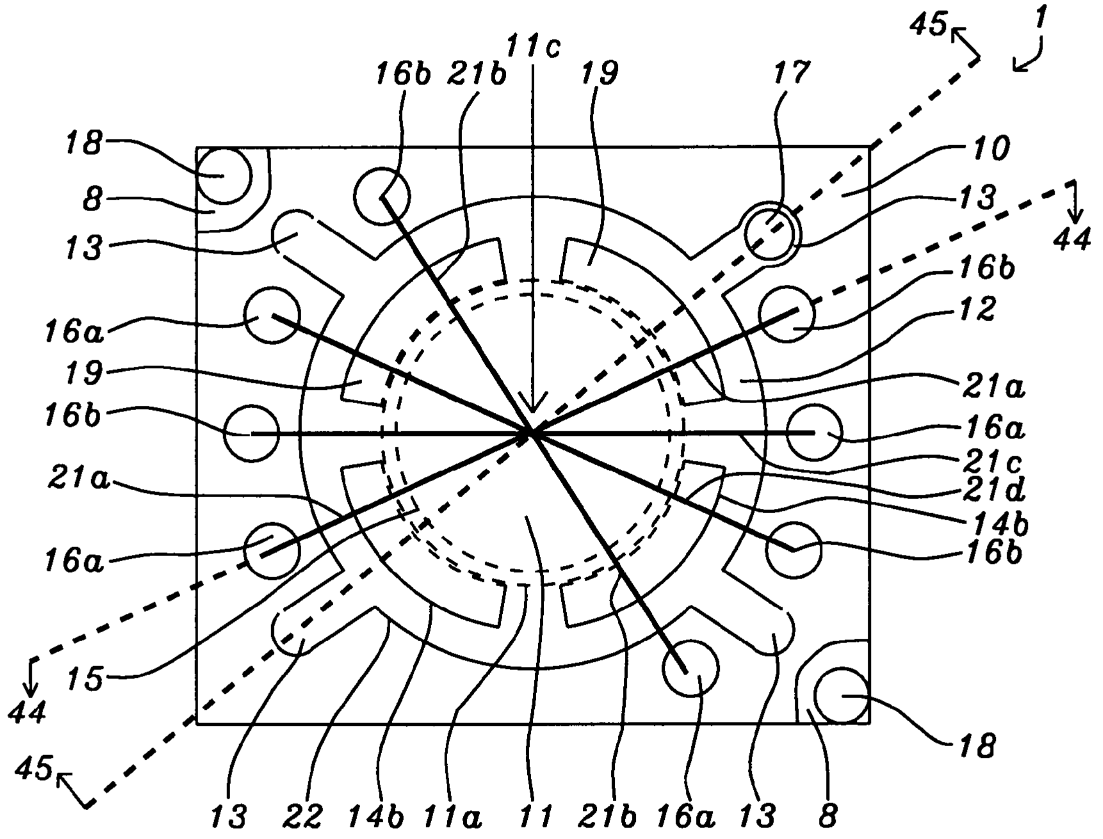
FIG. 3 is a top view showing a wire bonding scheme that improves impact resistance for the backplateless silicon microphone according to the first embodiment.

The circular spring 12 is also comprised of a plurality of perforations 20 that may be formed in a variety of patterns within inner beams 12*b*, between slots 14*b* and slot 22, and within the outer beams 12*a*. The perforations 20 can reduce the air damping in the narrow air gap (not shown) between the circular spring 12 and substrate 8 during vibrations. Perforations 20 in the circular spring 12 and perforated plates 19 are also used to facilitate the removal of portions of an underlying dielectric layer (not shown) during the fabrication process and thereby aid in the formation of a narrow air gap below the diaphragm 11, perforated plates 19, and spring 12. The pads 13 may have a circular shape and are positioned at the end of each outer beam 12*a*. There is also a plurality of "n" bonding pads 16 made of Al. Cu, Au, or other composite metal materials formed on the membrane layer 10 outside the slot 22. As shown in FIG. 3, the plurality of "n" bonding pads 16 may be connected by a plurality of "n/2" bonding wires where "n" is an even number ≧2, and preferably ≧4.

Returning to FIG. 1*a*, one or more of the pads 13 may have a first electrode 17 formed thereon. A first electrode 17 may be comprised of a metal layer such as Cr/Au that serves as a connecting point to external wiring. Additionally, there are one or more second electrodes 18 with the same composition as a first electrode 17. The second electrodes 18 are preferably formed on the substrate 8. A first electrode 17 and second electrode 18 may have a circular shape and are connected by wiring (not shown) to form a variable capacitor with one pole on the perforated plates 19 and spring 12 and another pole on the substrate 8. From a top view, a first electrode 17 has a smaller diameter than that of a pad 13 to allow for some overlay error and undercut release during fabrication. Optionally, the first and second electrodes 17, 18 may be a single or composite layer comprised of Al, Ti, Ta, Ni, Cu, or other metals.

Figure 1B:
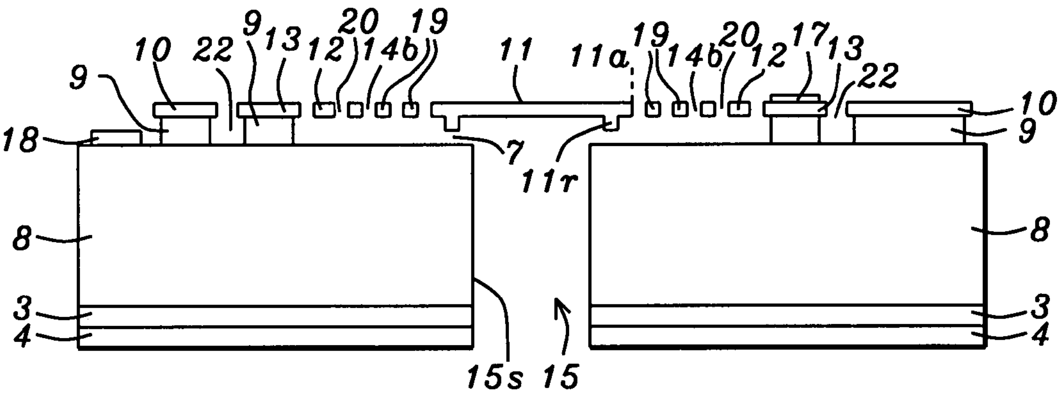
FIG. 1*b* is a cross-section along a first plane that bisects the backplateless silicon microphone in FIG. 1*a*.

Referring to FIG. 1*b*, a cross-sectional view along the plane 50-50 (FIG. 1*a*) is shown. The dielectric layer 9 may be an oxide such as silicon oxide and is formed on substrate 8. The air gap 7 is shown and is formed in a release step that will be explained in a later section. The backside hole 15 may have vertical sidewalls 15*s*. A hardmask comprised of an oxide layer 3 and nitride layer 4 is optionally removed following formation of the backside hole 15. There is a plurality of narrow ribs 11r on the bottom surface of the diaphragm 11 facing the backside hole 15 to reduce acoustical leakage and to prevent the diaphragm 11 from sticking to the substrate 8.

Figure 2A:
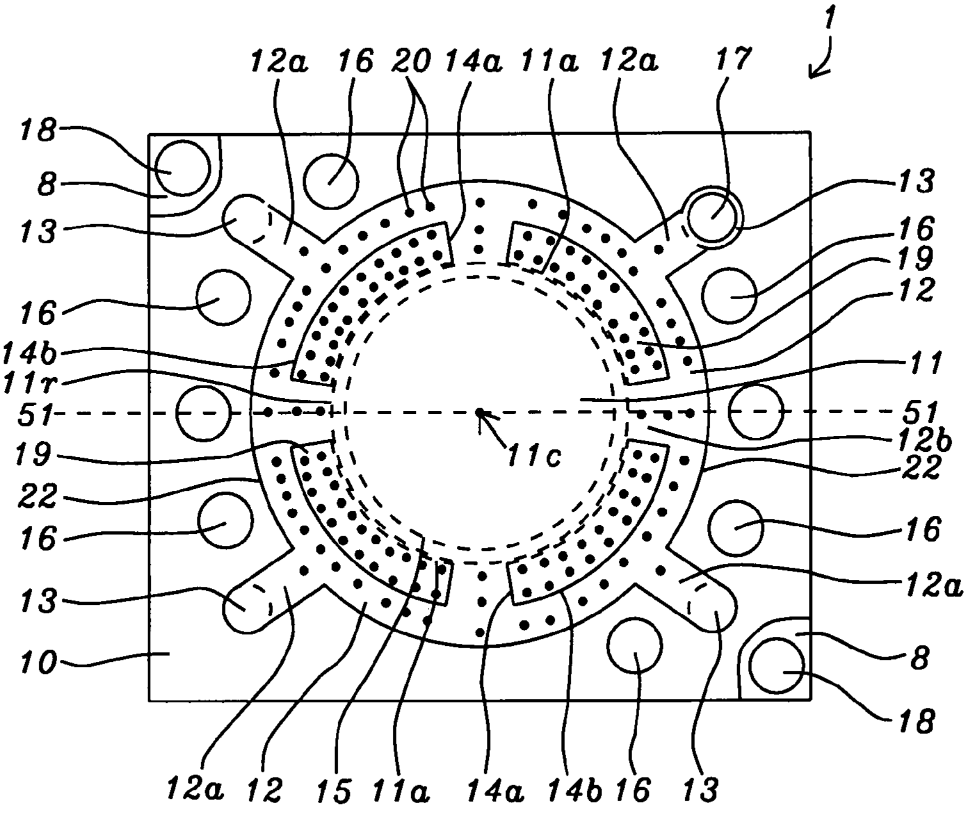
FIG. 2*a* is a top view similar to FIG. 1*a* except with a second plane that bisects the silicon microphone along a path that includes two bonding pads.

Referring to FIG. 2*a*, another view of the backplateless silicon microphone 1 of the first embodiment is shown that has a plane 51-51 bisecting the device and intersecting two bonding pads 16. In this embodiment, the bonding pads 16 are formed equidistant from the diaphragm center 11*c*. In this example, there are an unequal number of bonding pads 16 (either one or three) between adjacent pads 13. However, the present invention also encompasses an embodiment where there are an equal number of bonding pads between adjacent pads 13.

Figure 2B:
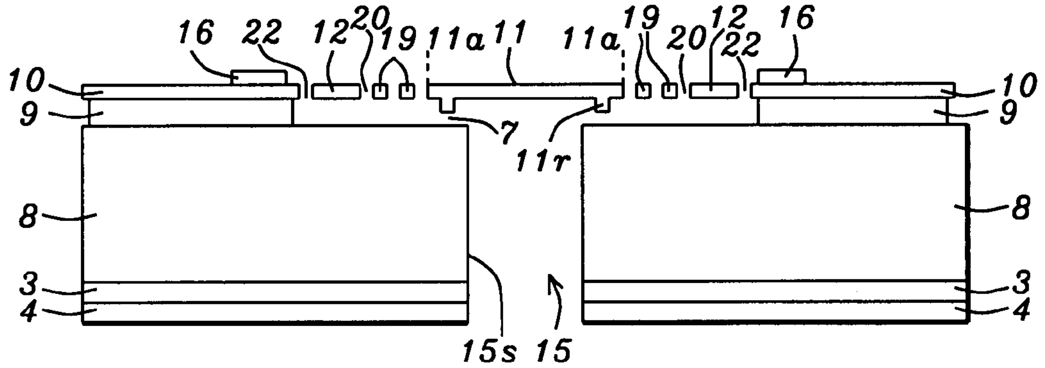
FIG. 2*b* is a cross-section along the second plane in FIG. 2*a* according to the first embodiment of the present invention.

Referring to FIG. 2*b*, a cross-sectional view taken from the plane 51-51 (FIG. 2*a*) illustrates the bonding pads 16 formed on the membrane layer 10 outside the slot 22.

Referring to FIG. 3, the first embodiment also encompasses a wire bonding protection method wherein the bonding pads 16 have been further classified as bonding pads 16*a*, 16*b* and serve as termination points for a plurality of bonding wires that cross over the diaphragm 11 and circular spring 12 and thereby function as stoppers to prevent large vibrations or strong impact from breaking the device. A first bonding pad 16*a* differs from a second bonding pad 16*b* only in that a first ball bond used at a first bonding pad normally leads to a higher loop height than a second bond which is employed at a second bonding pad. In other words, the greatest height of a bonding wire above the plane of the diaphragm 11 is usually closer to a first bonding pad 16*a* than a second bonding pad 16*b*. There is a second bonding pad 16*b* opposite each first bonding pad 16*a* along a plane that typically passes through the diaphragm center 11*c*. Preferably there is at least one bonding pad 16*a* or 16*b* between adjacent pads 13. A first bonding pad 16*a* and a second bonding pad 16*b* that are connected by a bonding wire are considered to be a pair of bonding pads. The bonding pads 16*a*, 16*b* may be comprised of the same metal as in the first electrodes 17 and second electrodes 18 and are formed on the membrane layer 10 at locations outside the slot 22. In one embodiment, the bonding pads 16*a*, 16*b* are formed proximate to the slot 22 and about the same distance from the diaphragm center 11*c*.

In the exemplary embodiment, there is a first bonding wire 21*a* that connects a first pair of bonding pads 16*a*, 16*b*. In addition, there is a second bonding wire 21*b* which connects a second pair of bonding pads 16*a*, 16*b*, a third bonding wire 21*c* connecting a third pair of bonding pads 16*a*, 16*b*, and a fourth bonding wire 21*d* connecting a fourth pair of bonding pads 16*a*, 16*b*. In this case, all four bonding wires 21*a*-21*d* cross above the diaphragm center 11*c*. Bonding wires 21*a*-21*d* may be comprised of Al or Au and may be formed by using conventional wedge bonding or a thermalsonic ball bonding process as known by those skilled in the art. Each bonding wire 21*a*-21*d* has a first end and a second end wherein a first end is attached to a first bonding pad 16*a* and a second end is attached to a second bonding pad 16*b*.

Figure 4:
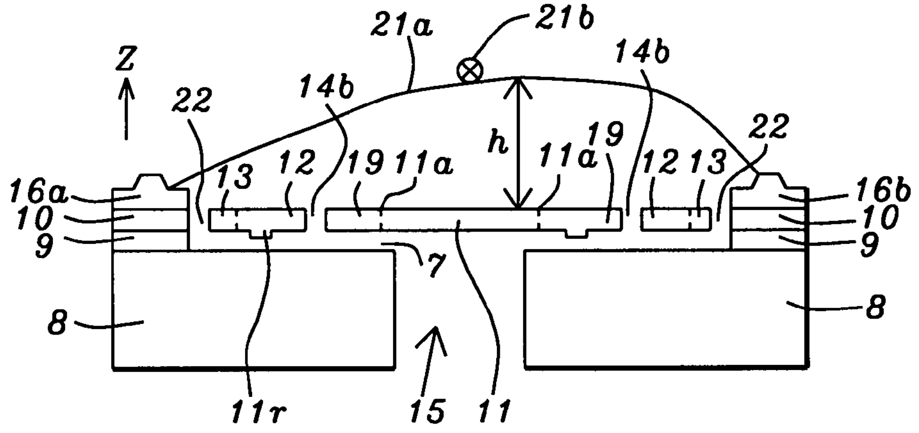
FIG. 4 is a cross-sectional view of bonding wires above the silicon substrate in FIG. 3 to illustrate how crossed wires enable a lower loop height.

Referring to FIG. 4, a cross-sectional view of the bonding scheme is shown from a plane 44-44 (FIG. 3) that includes the bonding wire 21*a*. The circular spring 12 and diaphragm 11 having outer edges 11*a* are suspended over the backside hole 15. A first pair of bonding pads 16*a*, 16*b* is depicted with a bonding wire 21*a* connection. A second bonding wire 21*b* is shown that is perpendicular to the plane of the paper. The second bonding wire 21*b* may physically touch first bonding wire 21*a* and force first bonding wire 21*a* toward the substrate and thereby provides a lower loop height h that simplifies the silicon microphone fabrication process. In particular, the lower loop height in the portion of bonding wire 21*b* that is nearer a second bonding pad (not shown) may press down on the first bonding wire 21*a* and thereby reduce loop height h. Likewise, bonding wires 21*c*, 21*d* (not shown) may cross over first bonding wire 21*a* and second bonding wire 21*b*.

Together, the four bonding wires 21*a*-21*d* form a stopper that restricts the motion of the diaphragm 11, perforated plates 19, and spring 12 in a z-direction and thereby prevents device breakage. It should be understood that the configuration where bonding wire 21*b* crosses over bonding wire 21*a* is not required. The critical aspect of the bonding scheme is that the bonding wires 21*a*-21*d* cross above the diaphragm 11 to limit the loop height h in at least one and preferably for a plurality of bonding wires, and provide an improved restraint for diaphragm movement compared with an edge restraint as in the prior art.

Figure 5:
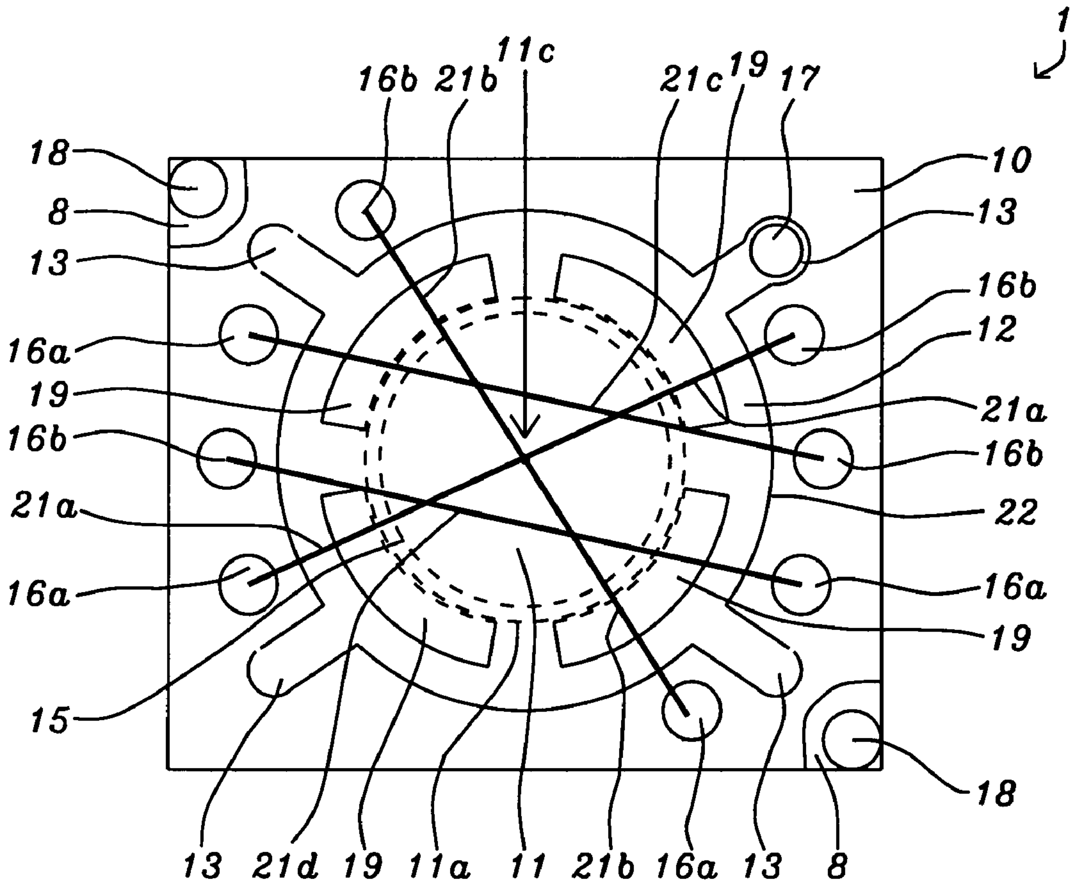
FIG. 5 is a top view showing a second wire bonding scheme that improves impact resistance for the backplateless silicon microphone according to the first embodiment.

Referring to FIG. 5, a second wire bonding scheme is depicted for the backplateless silicon microphone 1 of the first embodiment. In this embodiment, first bonding wire 21*a* and second bonding wire 21*b* have the same position as shown in the first embodiment (FIG. 3). However, the bonding wire 21*c* connects a third pair of bonding pads 16*a*, 16*b* that are not on opposite sides of the diaphragm center along a common plane. Likewise, bonding wire 21*d* is essentially formed parallel to bonding wire 21*c* and connects a fourth pair of bonding pads 16*a*, 16*b* that are not formed on a plane which passes through the diaphragm center 11*c*. Again, the crossing of bonding wires 21*a*-21*d* over the diaphragm 11 and circular spring 12 serve to restrict the upward motion of the aforementioned movable elements during large vibrations caused by large impact or unusually strong sound signals. A bonding wire 21*a*-21*b* may also cross one or more perforated plates 19. It should be understood that the performance of the silicon microphone 1 is not compromised by the bonding wires 21*a*-21*d* during normal operation when typical vibrations do not reach a loop height h (FIG. 4) or a height that impacts a bonding wire.

Figure 6:
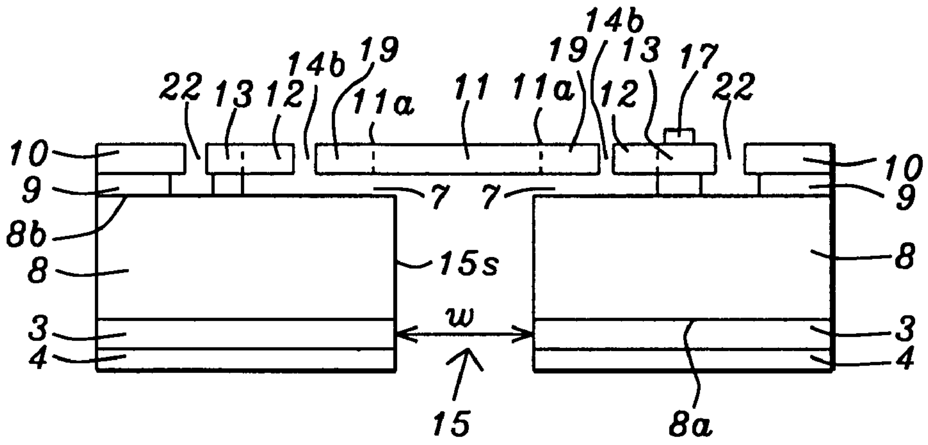
FIG. 6 is a cross-sectional view showing the various components in the backplateless silicon microphone depicted in FIG. 5.

Referring to FIG. 6, a cross-sectional view of the silicon microphone device according to the first embodiment and taken along the plane 45-45 (FIG. 2) is shown with the bonding wires removed. The pads 13 are rigidly fastened to the substrate 8 through a dielectric layer 9 that may be comprised of a thermal oxide, a low temperature oxide, a TEOS layer, or a PSG layer. Dielectric layer 9 serves as a spacer with an opening or air gap 7 formed therein to allow the diaphragm II having edges indicated by dashed lines 11*a*, perforated plates 19, and the circular spring 12 to be suspended over a backside hole 15 through which a sound signal may pass to induce a vibration in the diaphragm 11. In the exemplary embodiment, the backside hole 15 has a vertical sidewall 15*s* relative to the plane of the back side 8*a* of the substrate 8 and front side 8*b* (top surface) of the substrate which faces the diaphragm 11. Optionally, the portion of the backside hole 15 near the back side 8*a* of the substrate 8 may be larger than the portion of the backside hole 15 near the front side 8*b* of the substrate. Silicon nitride layer 3 and silicon oxide layer 4 serve as a hardmask during fabrication of the backside hole 15 and may be removed thereafter.

In a silicon-on-insulator (SOI) application, the dielectric layer 9 may be comprised of silicon oxide and the substrate 8 is made of silicon. Optionally, the dielectric layer 9 may be comprised of other dielectric materials used in the art and may be a composite with a plurality of layers therein.

As mentioned previously, there is a first electrode 17 comprised of a metal or composite such as Cr/Au above one or more pads 13. A first electrode 17 serves as a connecting point to external wiring. Additionally, there are one or more second electrodes (not shown) with the same composition as a first electrode formed on the top surface of substrate 8. It should be understood that the backplateless silicon microphone 1 is also comprised of a voltage bias source (including a bias resistor) and a source follower preamplifier but these components are not shown in order to simplify the drawing. A vibration in the diaphragm 11, perforated plates 19, and circular spring 12 is induced by a sound signal that passes through the backside hole 15 and impinges on the bottom surface of the diaphragm that faces the air gap 7. A vibration will cause a change in capacitance in the variable capacitor circuit that is converted into a low impedance voltage output by the source follower preamplifier as understood by those skilled in the art.

An exemplary process sequence for fabricating the backplateless silicon microphone 1 comprises forming a dielectric layer 9 such as silicon oxide by a conventional oxidation or deposition methods on the substrate 8 which may be doped silicon that is polished on both of its front and back sides. A membrane layer 10 is deposited on the dielectric layer 9 and will be subsequently patterned to form diaphragm 11, circular spring 12, pads 13, and perforated plates 19. Those skilled in the art will appreciate that the membrane layer 10 and dielectric layer 9 could also be formed directly by a well known wafer bonding process. In an SOI approach where the dielectric layer 9 is silicon oxide and the membrane layer 10 is doped silicon, substrate 8 and the membrane layer are provided with a resistivity of <0.02 ohm-cm.

Next, a hardmask comprised of one or more layers that will subsequently be used for fabricating a backside hole is formed on the back side 8*a* of substrate 8. In one embodiment, the hard mask is comprised of a thermal oxide layer 3 grown by a well known LPCVD method on the substrate 8 and a silicon nitride layer 4 deposited by an LPCVD method on thermal oxide layer 3. Note that the hard mask is simultaneously grown on the membrane film on the opposite side of the substrate 8 but is subsequently removed by well known wet chemical or dry etching methods.

One or more via openings (not shown) are formed in the dielectric layer 9 and membrane layer 10 to expose certain portions of the substrate 8. Then a conductive layer that will be used to form first electrodes, second electrodes, and bonding pads is formed on the membrane layer 10 and in the via openings by using a conventional physical vapor deposition (PVD) method. A photomask (not shown) is employed to selectively etch portions of the conductive layer to define one or more first electrodes 17 and bonding pads 16 on the membrane layer 10, and one or more second electrodes 18 within the via openings.

Next, the membrane layer 10 is selectively etched with a second photomask (not shown) to form slots 14*a*, 14*b*, 22. Perforations 20 are also formed by etching the patterned second photomask layer but are not shown in FIG. 6 in order to simplify the diagram. An opening is formed that exposes a portion of the back side 8*a* of the substrate 8 by employing a third photomask to selectively remove portions of the silicon nitride layer 4 and thermal oxide layer 3 by an etch process known to those skilled in the art. The opening is below the diaphragm 11 and has a width w corresponding to the desired width of the backside hole that will be formed in the following step. Exposed portions 8*a* of the substrate 8 may be etched with a plasma etch or deep RIE (DRIE) process to form a backside hole 15 with vertical sidewalls 15*s*. Optionally, a wet etch using TMAH or KOH, for example, may be employed to form a sloped sidewall (not shown) where the width of the backside hole 15 is greater as the distance from the diaphragm 11 becomes larger.

Conventional processing then follows in which the substrate 8 is diced to physically separate silicon microphone devices from each other. There is a final release step in which a portion of the dielectric layer 9 is removed to form the air gap 7. The perforations 20 may facilitate the removal of selected portions of the dielectric layer 9 during this step. In an SOI embodiment, a dielectric layer 9 made of oxide is removed to form an air gap 7 by a timed etch involving a buffered HF solution, for example. The dielectric layer 9 is removed with proper control so that portions of the dielectric layer below the pads 13 can be kept intact.

Figure 7A:
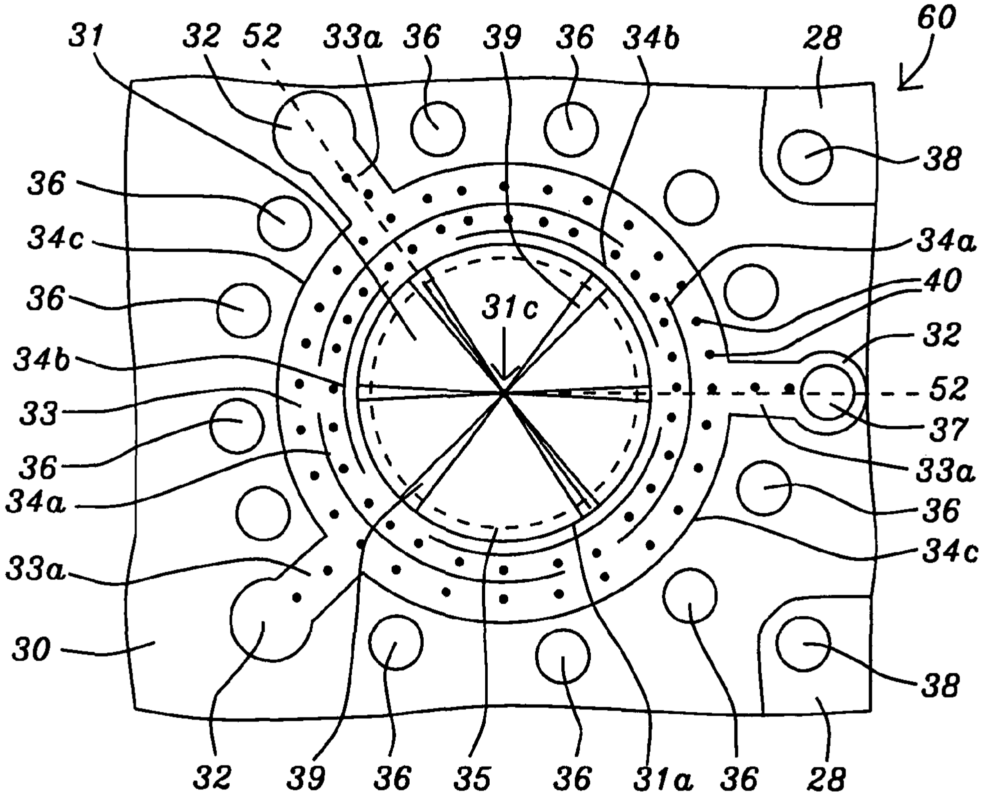
FIG. 7*a* is a top view of a backplateless silicon microphone with a double folded and perforated circular spring, and additional bonding pads for bonded wires according to a second embodiment of the present invention.

Referring to FIG. 7*a*, a topview is illustrated of a second embodiment for a silicon microphone 60 of the present invention. In the exemplary embodiment, a circular diaphragm 31 having an outer edge 31*a* is surrounded by a spring 33 that is essentially circular except for a plurality of beams 33*a* that protrude outward from circular spring 33. However, the present invention also encompasses an embodiment wherein the shape of the diaphragm 31 and surrounding spring 33 are polygonal. The diaphragm 31 and spring 33 are coplanar and the outer edge 31*a* extends beyond the circular perimeter 35 of an underlying backside hole. The diaphragm 31 may be comprised of doped silicon, doped polysilicon, Au, Ni, Cu, or other semiconductor materials or metals and is supported along its outer edge 31*a* by attachment to the inner edge of the circular spring 33 that is comprised of the same material and has the same thickness as the diaphragm 31. The plurality of "m" beams 33*a* serve as connections to a plurality of "m" pads 32 where m≧3. In the example shown, there are three beams 33*a* arranged equidistant from each other around the circular spring 33. Preferably, the pads 32 are equidistant from the diaphragm center 31*c*. The pads 32 are also made of the same membrane material as the diaphragm 31, beams 33*a*, and circular spring 33. Unlike the circular spring 33, beams 33*a*, and diaphragm 31 which have flexibility to vibrate in a direction perpendicular to the underlying backside hole (not shown), the pads 32 are rigidly held in position by attachment to an underlying dielectric layer (not shown) which in turn is formed on a substrate 28. Each pad 32 and an underlying portion of dielectric layer form an anchor.

An important feature is that the circular spring 33 has a plurality of middle slots 34*a* and plurality of inner slots 34*b* formed therein and each slot represents a narrow gap which is typically 3 to 10 microns wide along a diameter of the circular spring. Moreover, there is a continuous outer slot 34*c* that surrounds the spring 33, beams 33*a*, and pads 32 and separates the aforementioned elements from the surrounding membrane layer 30. The size of the gap in the inner slots 34*b*, middle slots 34*a*, and outer slot 34*c* is minimized based on processing constraints to prevent particles from entering the air gap (not shown) below the diaphragm 31. The middle slots 34*a* and inner slots 34*b* are patterned in such a way that the separation between any two inner slots 34*b* is aligned to a central portion of the nearest middle slot 34*a*. The circular spring 33 is essentially comprised of two interconnected rings, an inner ring formed between the outer edge 31*a* and the middle slots 34*a*, and an outer ring formed between the middle slots 34*a* and the outer slot 34*c*. As a result, the two interconnected rings within circular spring 33 enable a release of in-plane stress and allow more out-plane flexibility.

In the exemplary embodiment, there is a first set of three inner slots 34*b* arranged around the outer edge 31*a* of the diaphragm 31. Each inner slot 34*b* has a lengthwise direction that forms a curved (arc) shape which is concentric to the curved outer edge 31*a*, and is formed a first distance from the outer edge 31*a*. Each inner slot 34*b* has two ends and the distance between the two ends is defined as the length of an inner slot 34*b* which is preferably equivalent for all inner slots 34*b*. Preferably, the distance between a middle slot 34*a* and the nearest point on an adjacent inner slot 34*b* is less than the length of an inner slot 34*b*. Likewise, there is a second set of three middle slots 34*a* arranged in a circular pattern between the inner slots 34*b* and the outer slot 34*c*. Each middle slot 34*a* is formed a second distance from the diaphragm center 31*c* and the second distance is greater than the first distance. The arc length of each middle slot 34*a* may be the same as or larger than the length of an inner slot 34*b*. Each middle slot 34*a* has two ends and an arc shape that is concentric to the curved outer edge 31*a* and the distance between an end of one middle slot 34*a* and the nearest point on an adjacent inner slot 34*b* is preferably less than the length of a middle slot 34*a*.

Alternatively, other designs for the slots 34*a*, 34*b* and pads 32 may be used. For example, the number of slots within each set of middle slots 34*a* or inner slots 34*b* may be greater than three and the number of perforated beams 33*a* and pads 32 may be larger than three.

The circular spring 33 is also comprised of a plurality of holes or perforations 40 that may be formed in a variety of patterns between the diaphragm 31 and outer slot 34*c*, and within the beams 33*a*. The perforations 40 are needed to allow air ventilation and thus reduce the air damping in the narrow air gap (not shown) between the circular spring 33 and substrate 8 during vibrations. The pads 32 may have a circular shape and are positioned at the end of each perforated beam 33*a*. There is also a plurality of ribs 39 formed within diaphragm 31 to strengthen that element. Each rib 39 may extend from the diaphragm center 31*c* to the outer edge 31*a* and may gradually become wider as the distance from the diaphragm center increases.

Another important feature is a plurality of bonding pads 36 that are arrayed outside the outer slot 34*c*. There is at least one bonding pad 36 formed between two adjacent pads 32. The bonding pads 36 may be comprised of the same metal as in a first electrode 37 or in a second electrode 38 and are formed on the membrane layer 30 at locations outside the circular spring 33. In one embodiment, the bonding pads 36 are equidistant from the diaphragm center 31*c*. In the exemplary embodiment, there are four bonding pads 36 formed between each pair of adjacent pads 32. However, the present invention also encompasses an embodiment where there are an unequal number of bonding pads between adjacent pads 32. For example, there may be three bonding pads between a first pad 32 and a second pad 32 and four bonding pads between the second pad and a third pad 32.

One or more of the pads 32 may have a first electrode 37 formed thereon. A first electrode 37 may be comprised of a metal layer such as Cr/Au that serves as a connecting point to external wiring. Additionally, there are one or more second electrodes 38 with the same composition as a first electrode 37. The second electrodes 38 may be formed on the substrate 28 and may be formed at a greater distance from the diaphragm center 31*c* than a bonding pad 36 or first electrode 37. A first electrode 37 and second electrode 38 may have a circular shape and are connected by wiring (not shown) to form a variable capacitor with one pole on the perforated spring 33 and another pole on the substrate 28. From a top view, a first electrode 37 has a smaller diameter than that of a pad 32 to allow for some overlay error and undercut release during fabrication. Optionally, the first and second electrodes 37, 38 may be a single or composite layer comprised of Al, Ti, Ta, Ni, Cu, Au or other metals.

Figure 7B:
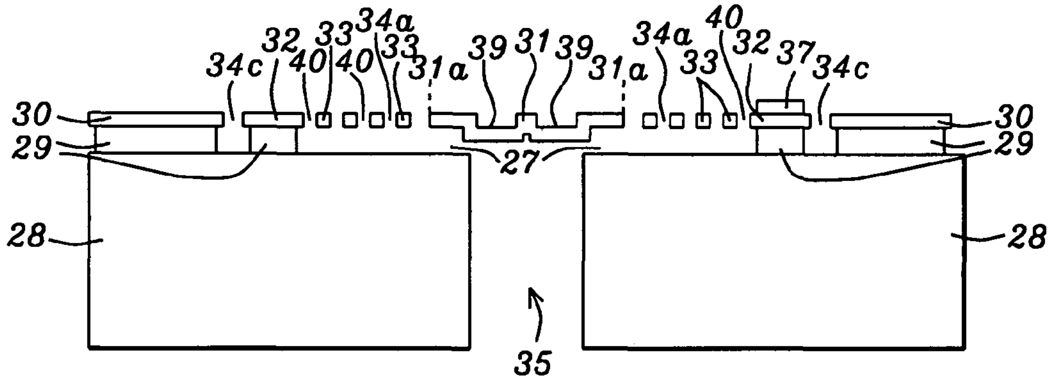
FIG. 7*b* is cross-sectional view of the silicon microphone structure in FIG. 7*a* along a first plane.

Referring to FIG. 7*b*, a cross-sectional view of the structure in FIG. 7*a* is shown from the plane 52-52. Note that the ribs 39 extend downward from the plane of the diaphragm 31 towards the backside hole 35. The membrane layer 30 is formed on a dielectric layer 29 that serves as a spacer between the membrane layer and substrate 28. An air gap 27 is formed within the dielectric layer 29 to allow the diaphragm 31 and spring 33 to vibrate up and down with respect to the backside hole 35.

Figure 8A:
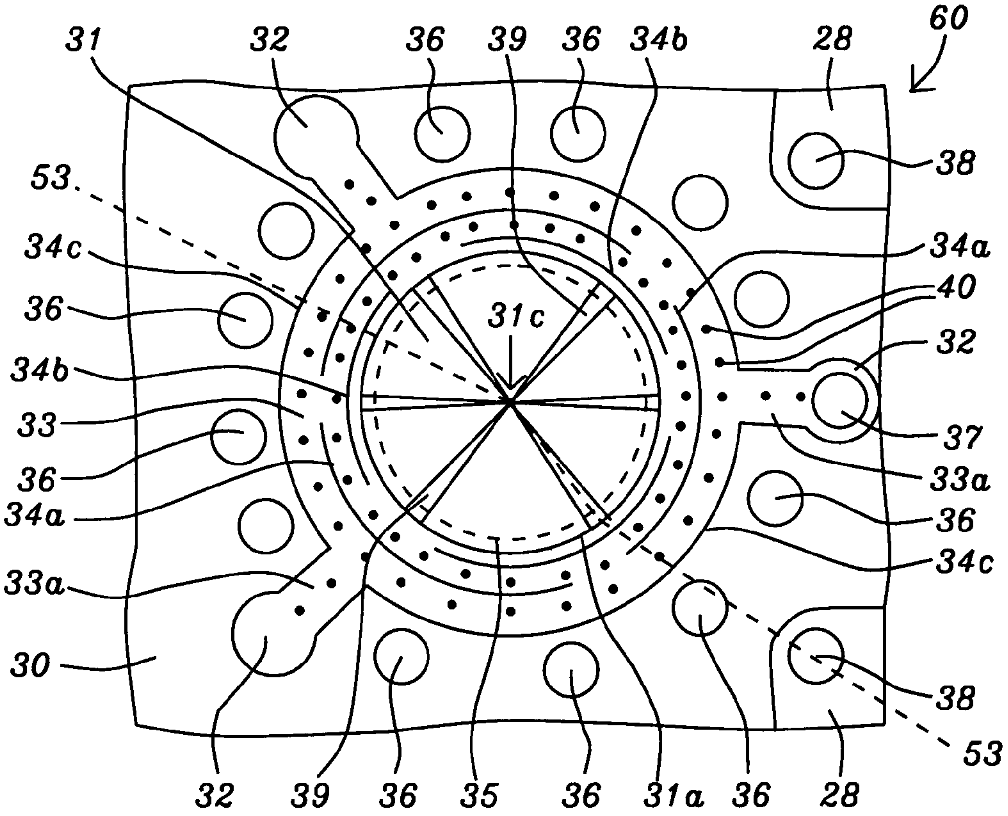
FIG. 8*a* is a top view of the silicon microphone according to the second embodiment that shows a second plane which intersects two bonding pads and a second electrode.
Figure 8B:
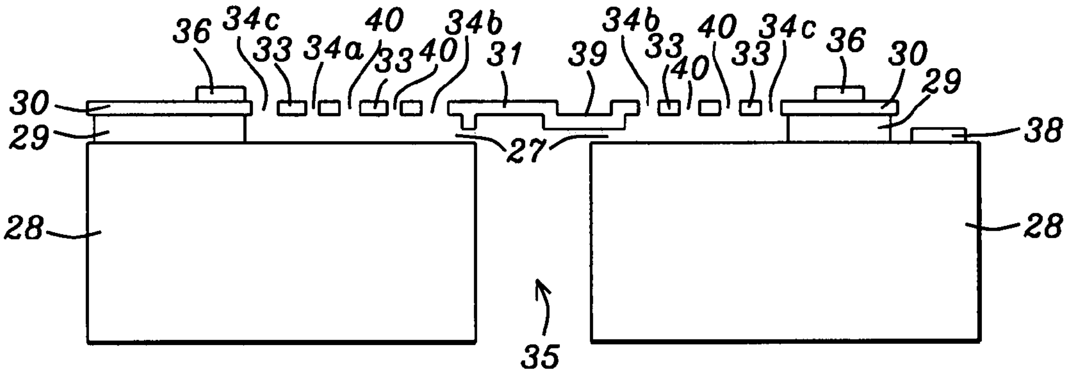
FIG. 8*b* is a cross-sectional view of the silicon microphone in FIG. 8*a* along the second plane.

Referring to FIG. 8*a*, a second view of the structure in FIG. 7*a* is shown with a plane 53-53 that passes through two bonding pads 36, one rib 39, and a second electrode 38. In FIG. 8*b*, a cross-sectional view is depicted from the plane 53-53 and shows the bonding pads 36 formed on the membrane layer 30 outside the outer slot 34*c*. Furthermore, a second electrode 38 is disposed on the substrate 28.

Figure 9:
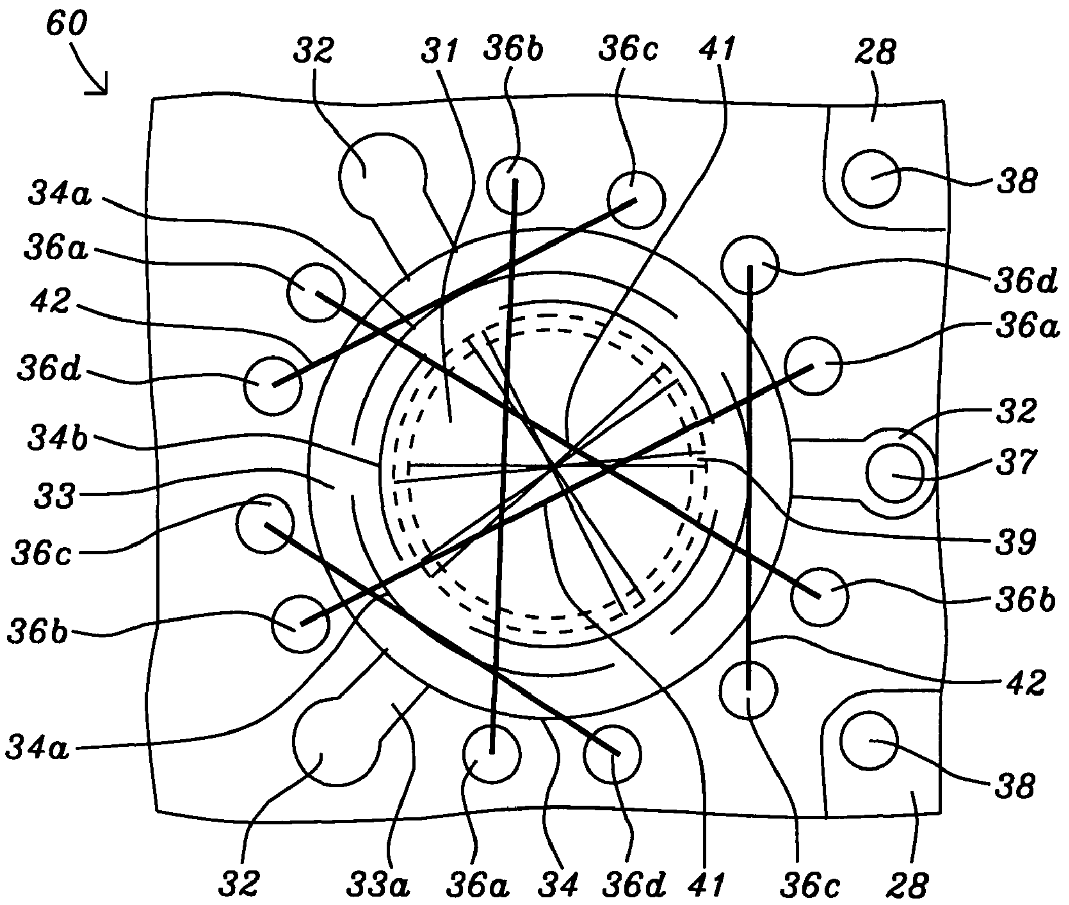
FIG. 9 is a top view showing a wire bonding scheme that improves impact resistance for the backplateless silicon microphone according to the second embodiment.

Referring to FIG. 9, the second embodiment is further comprised of a wire bonding protection scheme wherein a plurality of "n/2" bonding wires are employed to connect a plurality of "n" bonding pads where n is an even number $\geqq 2$, and preferably $\geqq 4$. As illustrated previously in FIG. 7*a*, the second embodiment may be comprised of twelve bonding pads in which four bonding pads are formed between each pair of pads 32. Bonding pads may be classified as a first bonding pad 36*a*, 36*c* or a second bonding pad 36*b*, 36*d*. First bonding pads 36*a*, 36*c* differ from second bonding pads 36*b*, 36*d* only in that the loop height of a bonding wire connecting a bonding pad 36*a* to a bonding pad 36*b* or connecting a bonding pad 36*c* to a bonding pad 36*d* is greater in a section of bonding wire that is closer to a first bonding pad than a second bonding pad.

Bonding pads 36*a*-36*d* serve as termination points for a plurality of bonding wires that cross over the circular spring 33, and in some cases the diaphragm 31, and thereby function as stoppers to prevent large vibrations or strong impact in the aforementioned moveable elements from breaking the device. First bonding pads 36*a*, 36*c* differ only in that a first bonding pad 36*a* is formed between a pad 32 and an adjacent second bonding pad 36*d* while a first bonding pad 36*c* is formed between a second bonding pad 36*b* and a second bonding pad 36*d*. Note that a second bonding pad 36*b* is formed between a pad 32 and a first bonding pad 36*c* while a second bonding pad 36*d* is formed between a first bonding pad 36*a* and a first bonding pad 36*c*. There is a first bonding pad 36*a* opposite every second bonding pad 36*b* and a first bonding pad 36*c* opposite each second bonding pad 36*d*. In this embodiment, first bonding pads (36*a* or 36*c*) and second bonding pads (36*b* or 36*d*) are formed in an alternating fashion along the outer slot 34*c*. Optionally, when n=2, there is only one bonding wire (not shown) connecting a first bonding pad 36*a* and a second bonding pad 36*b* and the bonding wire preferably crosses over the center of the diaphragm 31.

In the exemplary embodiment, there are three bonding wires 41 wherein each bonding wire 41 connects a first bonding pad 36*a* and a second bonding pad 36*b* and crosses over the circular spring 33 and diaphragm 31. Furthermore, there are three bonding wires 42 wherein each bonding wire 42 connects a first bonding pad 36*c* and a second bonding pad 36*d* and crosses over a circular spring 33 but not over the diaphragm 31. One or more bonding wires 41 may cross over a bonding wire 42 and one or more bonding wires 42 may cross over a bonding wire 41 to provide a high degree of restraint in limiting the upward motion (out of the plane of the paper) of the diaphragm 31 and circular spring 33 during a large vibration or strong impact. Thus, the bonding wires 41, 42 are advantageously used as a stopper to prevent the moveable elements from moving too far away from the substrate 28 and thereby prevent device breakage. Bonding wires 41, 42 may be made of Al or Au and may be formed by employing a well known thermalsonic gold wire bonding process or with a conventional wedge bonding process.

Alternatively, other wire bonding designs may be used to restrain the movement of diaphragm 31 and circular spring 33. Preferably, each bonding scheme comprises a plurality of bonding wires in which one or more bonding wires cross over the diaphragm 31 to provide maximum restraint during vibrations.

Figure 10:
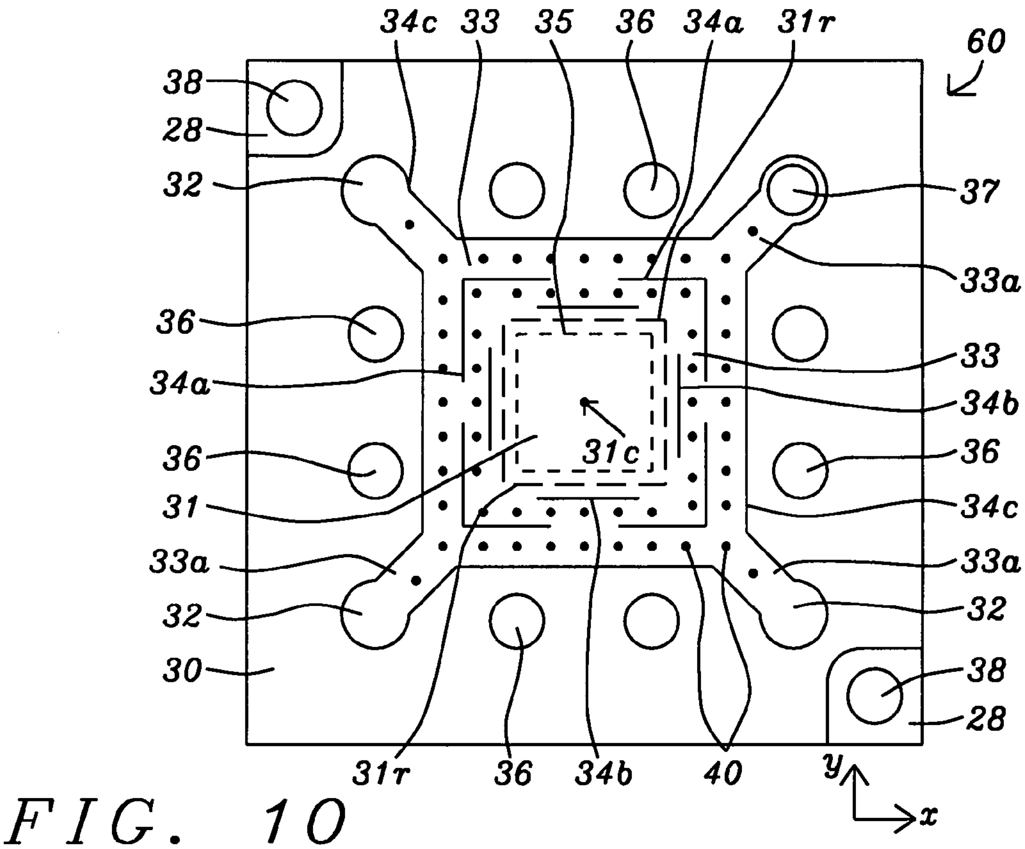
FIG. 10 is a top view a silicon microphone according to a third embodiment in which the diaphragm and surrounding spring have essentially a square shape and the spring has a doubled folded design and is anchored at four corners.

Referring to FIG. 10, a third embodiment is shown that is similar to the second embodiment except the shape of the diaphragm 31 and surrounding spring 33 are essentially square. In this example, there is a perforated beam 33*a* at each of the four corners of the square spring 33. Each of the perforated beams 33*a* connects to a pad 32 which together with a portion of an underlying dielectric layer (not shown) forms a rigid anchor. Preferably, there is a plurality of sealing ribs 31*r* proximate to each side (not shown) of the diaphragm and the sealing ribs may be formed equidistant from the nearest diaphragm side. It should be understood that the sealing ribs are formed on the bottom surface of the diaphragm 31 facing the backside hole 35 and help minimize acoustical leakage.

In addition, there are three sets of slots. The outer slot 34*c* forms an essentially square shape except for the outer slot sections around the pads 32 and perforated beams 33*a*. Each of the four inner slots 34*b* has a linear shape and is formed parallel to a side of the diaphragm 31 and is a first distance from the nearest side of the diaphragm. The middle slots 34*a* each have an "L" shape and a first section formed parallel to a first side of the diaphragm 31 and a second section that is formed parallel to a second side of the diaphragm. An end on first section and an end on second section are formed a second distance from a nearest side of the diaphragm 31 wherein the second distance is greater than the first distance. The ends of adjacent middle slots 34*a* are separated by a portion of spring 33. Preferably, there is an inner slot 34*b* formed between the diaphragm 31 and an end of a middle slot 34*a*.

The spring 33 in the third embodiment is considered to have a double folded spring configuration wherein an inner folded spring portion is formed between the inner slots 34*b* and the middle slots 34*a* and an outer folded spring portion is formed between the middle slots and the outer slot 34*c*.

Other aspects of the second embodiment are carried forth in the third embodiment such as a plurality of "n" bonding pads 36 formed outside the outer slot 34*c* on membrane layer 30 and preferably between adjacent pads 32. There is a first electrode 37 formed on one or more pads 32 and one or more second electrodes 38 formed on substrate 28. From a top view, the sides (outer edges) of the diaphragm 31 and sealing ribs 31*r* are a greater distance (x, y direction) from the diaphragm center 31*c* than the backside hole 35 which may have a square shape. The third embodiment also encompasses a bonding wire protection scheme in which "n/2" bonding wires (not shown) are used to connect the "n" bonding pads 32 as described in previous embodiments.

Figure 11:
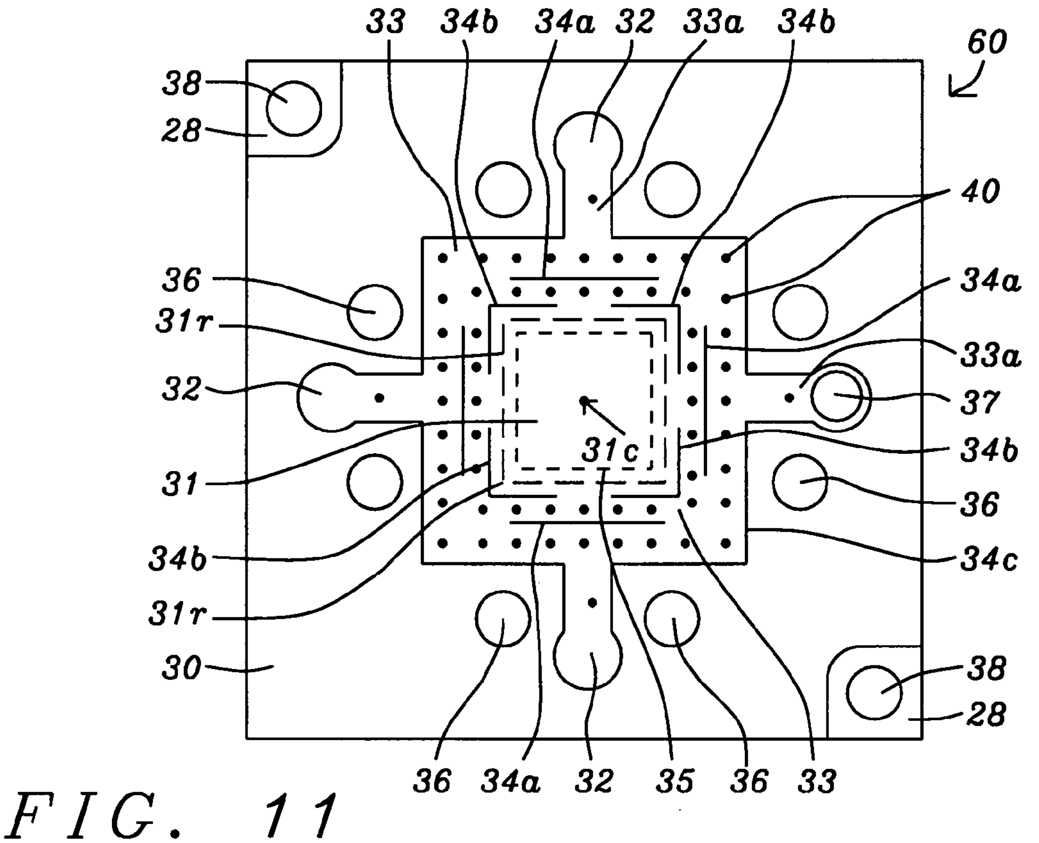
FIG. 11 is a top view showing a silicon microphone according to a fourth embodiment that is similar to FIG. 10 except the double folded spring is anchored at four sides and the placement of the inner slots and middle slots is shifted.

Referring to FIG. 11, a fourth embodiment is shown wherein each of the perforated beams 33*a* in the third embodiment (FIG. 10) is shifted from a corner of the square spring 33 to a position proximate to a midpoint of a side of the square spring. Likewise, each of the pads 32 is moved and connects with an end of a perforated beam 33*a* opposite the spring 33. One or more bonding pads 36 are formed adjacent to a pad 32 along each side of spring 33 on membrane layer 30. The inner slots 34*b* are shifted such that a first section of each inner slot is formed parallel to a first side of the diaphragm 31 and a second section is formed parallel to a second side of the diaphragm, thus forming an "L" shape. An end of the first section and an end of the second section are formed a first distance from the nearest side of a diaphragm edge (not shown). Each of middle slots 34*a* is formed parallel to a side of diaphragm 31 at a second distance from the diaphragm edge wherein the second distance is greater than the first distance.

A bonding wire protection scheme is employed similar to that described in the first two embodiments. In particular, a plurality of "n/2" bonding wires (not shown) connect a plurality of "n" bonding pads 36 and thereby restrict the upward motion of the diaphragm 31 away from the backside hole 35 during large vibrations caused by a strong impact or a large sound signal. Preferably, each of the "n/2" bonding wires cross over at least a portion of the diaphragm 31 or spring 33.

Figure 12:
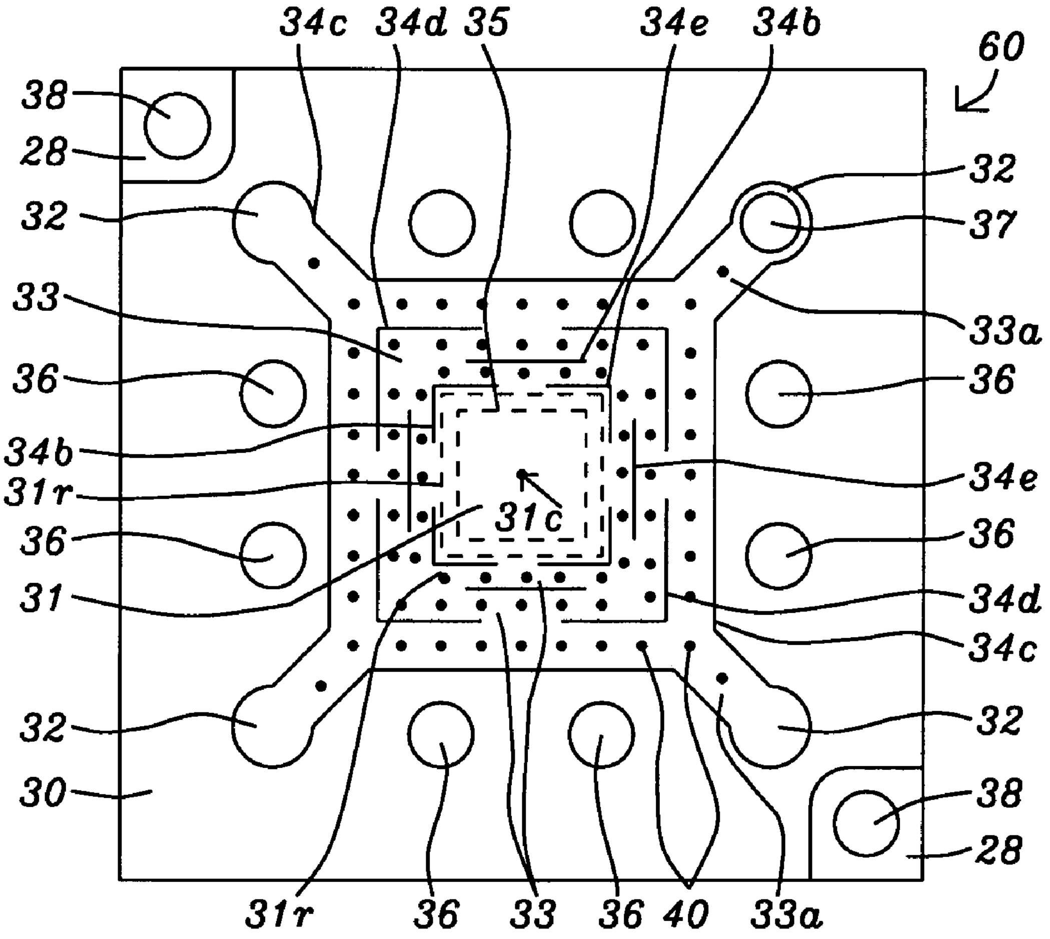
FIG. 12 is a top view showing a silicon microphone according to a fifth embodiment in which the square spring has a triple folded design that incorporates a fourth type of slot in the spring.

Referring to FIG. 12, a fifth embodiment is depicted that is similar to the third embodiment with respect to a perforated beam 33*a* and a pad 32 positioned at each of the four corners of a square spring 33. The fifth embodiment is also related to the fourth embodiment with regard to the positions of the inner two sets of slots. In particular, the slot configuration in spring 33 has been modified to include a fourth type of slot to give a triple folded spring configuration. In this example, inner slots 34*b* and middle inner slots 34*e* are formed similar to inner slots 34*b* and middle slots 34*a*, respectively, in FIG. 11. There is also a plurality of middle outer slots 34*d* formed between middle inner slots 34*e* and outer slot 34*c*. In the exemplary embodiment, there are four middle inner slots 34*e* and four middle outer slots 34*d*. Each middle outer slot 34*d* has one section formed parallel to a first side of the diaphragm 31 and a second section formed parallel to a second side of the diaphragm. A middle outer slot 34*d* has two ends that are formed a third distance from the nearest side of the diaphragm. The third distance is greater than the second distance. Furthermore, an end of one middle outer slot 34*d* is separated from an end of an adjacent middle outer slot by a portion of spring 33. Preferably, there is a middle inner slot 34*e* formed between an end of a middle outer slot 34*d* and the diaphragm 31. The triple folded spring configuration provides additional out-plane flexibility and relieves more in-plane stress than the double folded spring designs in previous embodiments. The gap width in middle inner slots 34*e* and middle outer slots 34*d* is 3 to 10 microns as in previous embodiments.

As in the previous embodiments, a bonding wire protection scheme comprised of "n/2" bonding wires (not shown) connecting "n" bonding pads 36 is advantageously employed to restrict the upward motion of the diaphragm 31 away from the backside hole 35 and thereby imparts impact proof resistance to the silicon microphone 60. Preferably, each of the "n/2" bonding wires cross over at least a portion of the diaphragm 31 or spring 33. The bonding pads 36 may be formed equidistant from the outer slot 34*c*. Preferably, there are one or more bonding pads 36 between adjacent pads 32.

All of the embodiments provide an advantage over prior art in that the backplateless silicon microphone disclosed herein has the improved impact proof capability because the bonding wires provide restraint over the entire surface of the diaphragm and circular spring compared with only an edge restraint in the prior art. Moreover, the bonding wires can be fabricated during the same process that forms wire connections between first electrodes and second electrodes and thus do not add any complexity to the production process. In addition, the unique slot design allows in-plane stress to be released and permits more out-plane flexibility to prevent device breakage.

While this invention has been particularly shown and described with reference to, the preferred embodiments thereof, it will be understood by those skilled in the art that various changes in form and details may be made without departing from the spirit and scope of this invention.

We claim:

1. A backplateless silicon microphone, comprising:
(a) a substrate having a front side and a back side with a backside hole formed through said substrate;
(b) a dielectric spacer layer formed on the front side of the substrate;
(c) a diaphragm that is aligned above said backside hole and is made of a membrane layer formed on the dielectric spacer layer, said diaphragm has a center and an outer edge;
(d) a plurality of perforated plates having one side adjoining said outer edge of the diaphragm, said perforated plates are made of said membrane layer;
(e) a perforated spring that is made of said membrane layer and is comprised of a plurality of outer beams that are connected to a plurality of "m" pads where "m" ≧3, and a plurality of inner beams that are attached to the outer edge of said diaphragm;
(f) a plurality of "m" pads made of said membrane layer and formed on the dielectric spacer layer wherein a pad and an underlying portion of the dielectric spacer layer form a rigid anchor; and
(g) an air gap formed within said dielectric spacer layer and below said diaphragm, plurality of perforated plates, and spring.

2. The backplateless silicon microphone of claim 1 further comprised of a first electrode formed on one or more pads, and one or more second electrodes formed on the substrate wherein a first electrode and a second electrode are connected to form a variable capacitor with one pole on said perforated plates and spring and another pole on said substrate.

3. The backplateless silicon microphone of claim 1 wherein the diaphragm, spring, plurality of perforated plates, and plurality of pads are coplanar and comprised of doped silicon, doped polysilicon, Au, Cu, Ni, other semiconductor materials or metals.

4. The backplateless silicon microphone of claim 1 wherein the diaphragm, plurality of perforated plates, spring, and plurality of pads are defined by a plurality of slots formed in said membrane layer.

5. The backplateless silicon microphone of claim 4 wherein said pads are equidistant from the center of said diaphragm.

6. The backplateless silicon microphone of claim 4 wherein said plurality of slots has a width of about 3 to 10 microns.

7. The backplateless silicon microphone of claim 1 wherein said diaphragm, plurality of perforated plates, and spring have a circular shape or a polygonal shape.

8. A backplateless silicon microphone, comprising:
(a) a substrate having a front side and a back side with a backside hole formed through said substrate;
(b) a dielectric spacer layer formed on the front side of the substrate;
(c) a diaphragm that is aligned above said backside hole and is made of a membrane layer formed on the dielectric spacer layer, said diaphragm has a center and an outer edge;
(d) a spring surrounding and connecting to the diaphragm, said spring is made of said membrane layer and has a plurality of perforations formed therein, and is connected to a plurality of "m" pads where m≧3;
(e) a plurality of "m" pads made of said membrane layer and formed on the dielectric spacer layer wherein a pad and an underlying portion of the dielectric spacer layer form a rigid anchor; and
(f) an air gap formed within said dielectric spacer layer and below said diaphragm and spring.

9. The backplateless silicon microphone of claim 8 further comprised of a first electrode formed on one or more pads, and one or more second electrodes formed on the substrate wherein a first electrode and a second electrode are connected to form a variable capacitor with one pole on said perforated spring and another pole on said substrate.

10. The backplateless silicon microphone of claim 8 wherein the diaphragm, spring, and plurality of pads are coplanar and comprised of doped silicon, doped polysilicon, Au, Cu, Ni, other semiconductor materials or metals.

11. The backplateless silicon microphone of claim 8 wherein the diaphragm and spring are circular or have a polygonal shape.

12. The backplateless silicon microphone of claim 11 wherein the plurality of "m" pads is equidistant from the center of said diaphragm.

13. The backplateless silicon microphone of claim 11 wherein said spring is connected to said "m" pads by "m" perforated beams, and the diaphragm, spring, perforated beams, and plurality of pads are defined by a plurality of slots formed in said membrane layer.

14. The backplateless silicon microphone of claim 13 wherein the diaphragm and spring have a circular shape and said plurality of slots comprises:
(a) a plurality of inner slots each having an arc shape that is concentric with the outer edge of said circular diaphragm and formed a first distance from said outer edge;
(b) a plurality of middle slots each having an arc shape that is concentric with the outer edge of said circular diaphragm and formed a second distance from said outer edge wherein said second distance is greater than said first distance; and
(c) a continuous outer slot that defines an outer edge of the spring, perforated beams, and pads by separating the aforementioned elements from the membrane layer.

15. The backplateless silicon microphone of claim 14 wherein any two adjacent inner slots are separated by a certain portion of the spring, and said certain portion is aligned adjacent to a central portion of the nearest middle slot.

16. The backplateless silicon microphone of claim 14 wherein each of the plurality of inner slots and plurality of outer slots has a width of about 3 to 10 microns.

17. The backplateless silicon microphone of claim 13 wherein the diaphragm and spring each have four sides and four corners to form a square shape and there is a perforated beam attached to each of the four corners of the square spring, said plurality of slots comprises:
(a) four inner slots wherein each inner slot is linear and is formed parallel to a side of the diaphragm and at a first distance from said side of the diaphragm;
(b) four middle slots wherein each middle slot has two ends and a first section formed parallel to a first side of the diaphragm and a second side formed parallel to a second side of the diaphragm to form an "L" shape, said two ends are formed a second distance from a nearest side of the diaphragm wherein said second distance is greater than said first distance; and
(c) a continuous outer slot that defines an outer edge of the spring, perforated beams, and pads by separating the aforementioned elements from the membrane layer.

18. The backplateless silicon microphone of claim 13 wherein the diaphragm and spring each have four sides and four corners to form a square shape and there is a perforated beam attached to each of the four sides of the square spring, said plurality of slots comprises:

(a) four inner slots wherein each inner slot has two ends and a first section formed parallel to a first side of the diaphragm and a second side formed parallel to a second side of the diaphragm to form an "L" shape, said two ends are formed a first distance from a nearest side of the diaphragm;

(b) four middle slots wherein each middle slot is linear and is formed a second distance from a side of the diaphragm wherein said second distance is greater than said first distance; and (c) a continuous outer slot that defines an outer edge of the spring, perforated beams, and pads by separating the aforementioned elements from the membrane layer.

19. The backplateless silicon microphone of claim 13 wherein the diaphragm and spring each have four sides and four corners to form a square shape and there is a perforated beam attached to each of the four corners of the square spring, said plurality of slots comprises:

(a) four inner slots wherein each inner slot has two ends and a first section formed parallel to a first side of the diaphragm and a second side formed parallel to a second side of the diaphragm to form an "L" shape, said two ends are formed a first distance from a nearest side of the diaphragm;

(b) four middle inner slots wherein each middle slot is linear and is formed a second distance from a side of the diaphragm wherein said second distance is greater than said first distance;

(c) four middle outer slots wherein each middle outer slot has two ends and a first section formed parallel to a first side of the diaphragm and a second side formed parallel to a second side of the diaphragm to form an "L" shape wherein said two ends are formed a third distance from a nearest side of the diaphragm and said third distance is greater than said second distance; and (d) a continuous outer slot that defines an outer edge of the spring, perforated beams, and pads by separating the aforementioned elements from the membrane layer.

20. A wire bonding protection method to provide impact resistance to a surface microstructure comprised of a rigid membrane layer that surrounds moveable parts made of the same membrane layer, comprising:

(a) providing a plurality of "n" bonding pads wherein n is an even number ≧2 on said rigid membrane layer proximate to an outer edge that defines said moveable parts;

(b) forming one or a plurality of "n/2" bonding wires that connect said bonding pads wherein each of said one or plurality of "n/2" bonding wires cross over at least a portion of the moveable parts and thereby serve to restrain any unusually large vibration of moveable parts due to a large impact.

21. The wire bonding protection method of claim 20 wherein said plurality of "n" bonding pads are made of aluminum, copper, gold, or other composite metal materials.

22. The wire bonding protection method of claim 20 wherein said one or plurality of bonding wires are made of Al or Au and are attached to said plurality of "n" bonding pads by using conventional wedge bonding or a themalsonic ball bonding process.

23. The wire bonding protection method of claim 20 wherein each of said one or plurality of "n/2" bonding wires has two ends in which a first and second end are attached to a first bonding pad and a second bonding pad, respectively, and said first bonding pads and said second bonding pads are formed in an alternating fashion along said outer edge.

24. The wire bonding protection method of claim 20 wherein the plurality of "n/2" bonding wires is comprised of at least two wires where a first wire crosses over a second wire and thereby lowers a loop height in the second wire, said crossed wires also provide a restraint to a displacement of moveable parts away from a plane of the membrane layer.

25. A method of forming a backplateless silicon microphone with wire bonding protection, comprising:

(a) providing a substrate having a front side and a back side wherein a stack comprised of a lower dielectric spacer layer and upper membrane layer is formed on said front side, and a hardmask is disposed on said back side;

(b) forming one or more via openings in said membrane layer and dielectric spacer layer to expose certain portions of said substrate;

(c) forming a plurality of first electrodes and a plurality of "n" bonding pads at certain locations on said membrane layer, and one or more second electrodes in said one or more via openings on said substrate;

(d) etching said membrane film to form a plurality of perforated holes and a plurality of slot shaped openings therein to define a diaphragm having a center and an outer edge, a spring surrounding and connected to said diaphragm wherein said spring has perforations formed therein and is connected to a plurality of "m" pads where m≧3;

(e) etching an opening in said hard mask and forming a backside hole through the substrate that is aligned below said diaphragm;

(f) removing a portion of said dielectric spacer layer in a release step to form an air gap between the diaphragm and back side hole and between the spring and substrate; and (g) connecting said plurality of "n" bonding pads with a plurality of "n/2" bonding wires such that each bonding wire connects two bonding pads and crosses at least a portion of the spring or the diaphragm and thereby serves as a restraint to limit a vibration of the spring or the diaphragm in a direction away from the substrate.

* * * * *